(12) United States Patent
Hedberg

(10) Patent No.: US 6,229,380 B1
(45) Date of Patent: May 8, 2001

(54) OUTPUT BUFFER SWITCHING CIRCUIT

(75) Inventor: Mats Hedberg, Haninge (SE)

(73) Assignee: Telefonaktiebolaget LM Ericsson (publ), Stockholm (SE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/101,684
(22) PCT Filed: Dec. 23, 1996
(86) PCT No.: PCT/EP96/05827
  § 371 Date: Sep. 21, 1998
  § 102(e) Date: Sep. 21, 1998
(87) PCT Pub. No.: WO97/26707
  PCT Pub. Date: Jul. 24, 1997

(30) Foreign Application Priority Data

Jan. 16, 1996 (DE) .............................. 196 01 386

(51) Int. Cl.⁷ .................................................. G05F 3/02
(52) U.S. Cl. ................................... 327/536; 327/534
(58) Field of Search ........................ 327/536, 534; 326/81

(56) References Cited

U.S. PATENT DOCUMENTS

| | | |
|---|---|---|
| 4,074,151 | 2/1978 | Buckley, III et al. . |
| 4,574,273 * | 3/1986 | Atsumi et al. .................... 326/81 |
| 4,965,696 * | 10/1990 | Kumpfmueller et al. .......... 361/160 |
| 5,128,560 * | 7/1992 | Chern et al. ...................... 327/543 |
| 5,610,503 * | 5/1997 | Fogg et al. ....................... 363/283 |
| 5,774,348 * | 6/1998 | Druce ............................... 363/60 |
| 5,834,948 * | 11/1998 | Yoshizaki et al. ................. 326/81 |
| 5,986,901 * | 11/1999 | Weng ............................... 363/44 |
| 5,994,921 * | 11/1999 | Hedberg ............................ 326/81 |

FOREIGN PATENT DOCUMENTS

| | | |
|---|---|---|
| 43 37 076 | 6/1994 | (DE) . |
| 196 08 477 | 9/1996 | (DE) . |
| 195 10 947 | 11/1996 | (DE) . |
| 0 680 148 | 11/1995 | (EP) . |
| 92/09141 | 5/1992 | (WO) . |

OTHER PUBLICATIONS

Khorramabadi et al., "A Highly Efficient CMOS Line Driver with 80–dB Linearity for ISDN U–Interface Applications", IEEE Journal of Solid–State Circuits, Dec. 27, 1992, No. 12, pp. 1723–1729.

Tomasini et al., "A Fully Differential CMOS Line Driver for ISDN", IEEE Journal of Solid–State Circuits, Apr. 25, 1990, No. 2, pp. 546–554.

"IEEE Standard for Low–Voltage Differential Signals for SCI (LVDS): Draft 1.00", Dec. 30, 1993, Miroprocessor and Microcomputer Standards Subcommittee of the IEEE Computer Society.

English language translation of Maxim Engineering Journal, Jan. 1995; Power Supplies for Pentium™, PowerPC™, and Beyond.

* cited by examiner

Primary Examiner—Terry D. Cunningham
(74) Attorney, Agent, or Firm—Burns, Doane, Swecker & Mathis, L.L.P.

(57) ABSTRACT

An output buffer switching circuit for producing digital output signals comprises a buffer amplifier section (12) for driving a load, a low-impedance transmission line (9) and a power supply section (11) for delivering power to the buffer amplifier section (12). The power supply section (11) comprises a pair of input connections (1, 2) for connection to a voltage source and a pair of output connections (3, 4) connected to the amplifier section (12), reactance devices for temporary energy storage and switching devices adapted to provide a charge phase in which energy from the voltage source is stored in the reactance devices and a discharge phase in which at least some of the energy stored in the reactance devices is discharged to the output connections (3, 4).

27 Claims, 8 Drawing Sheets

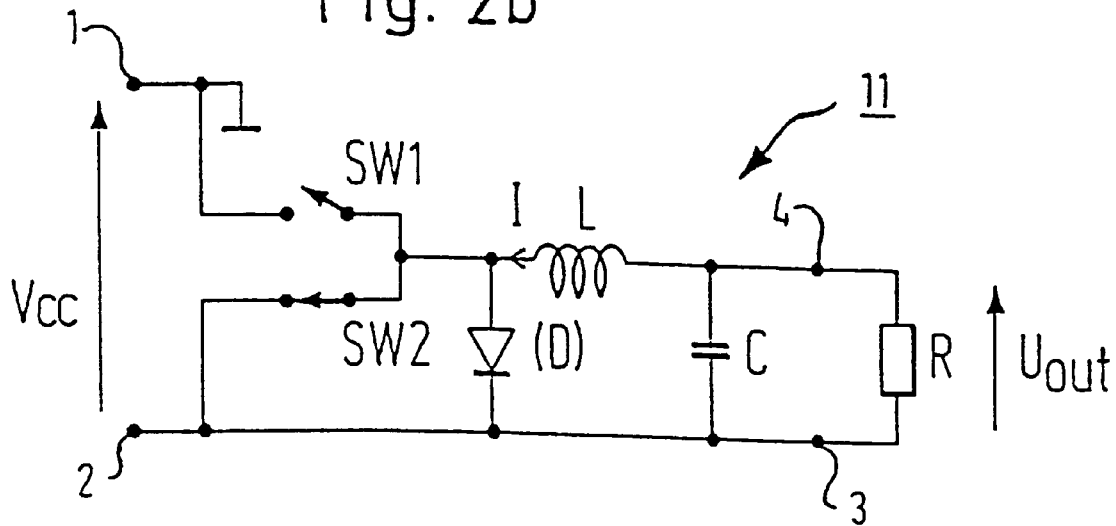
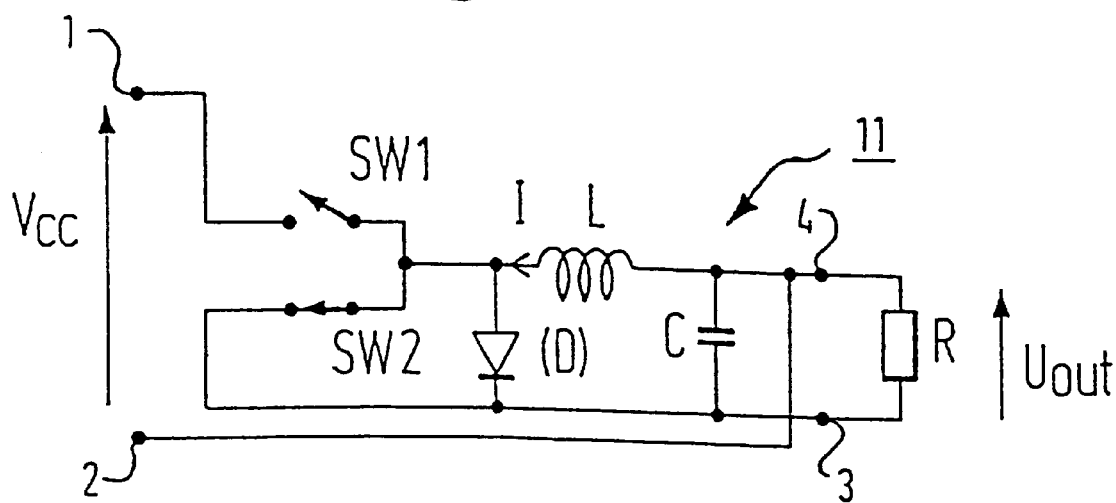

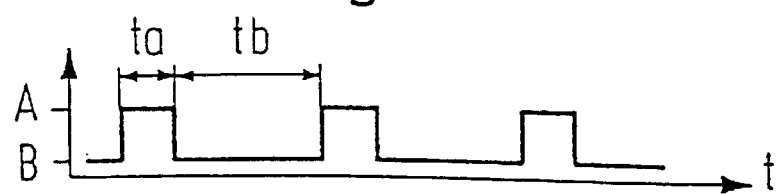
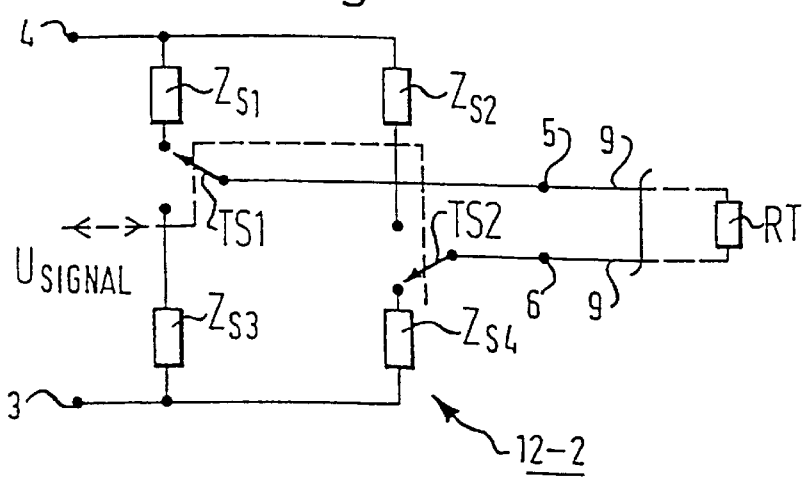
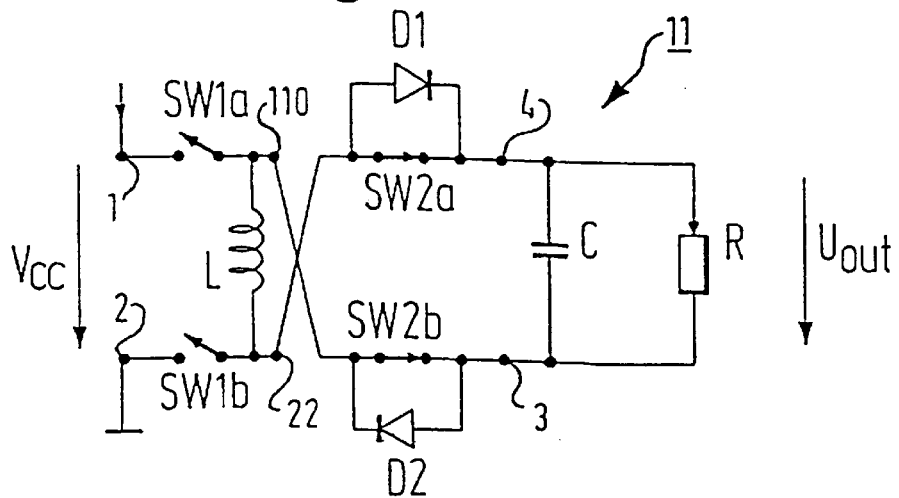

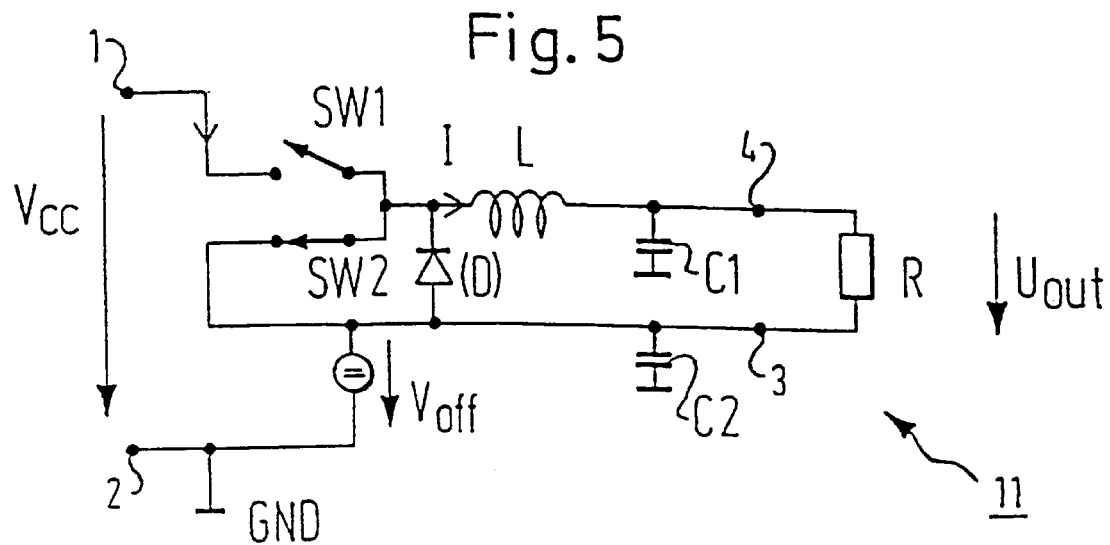
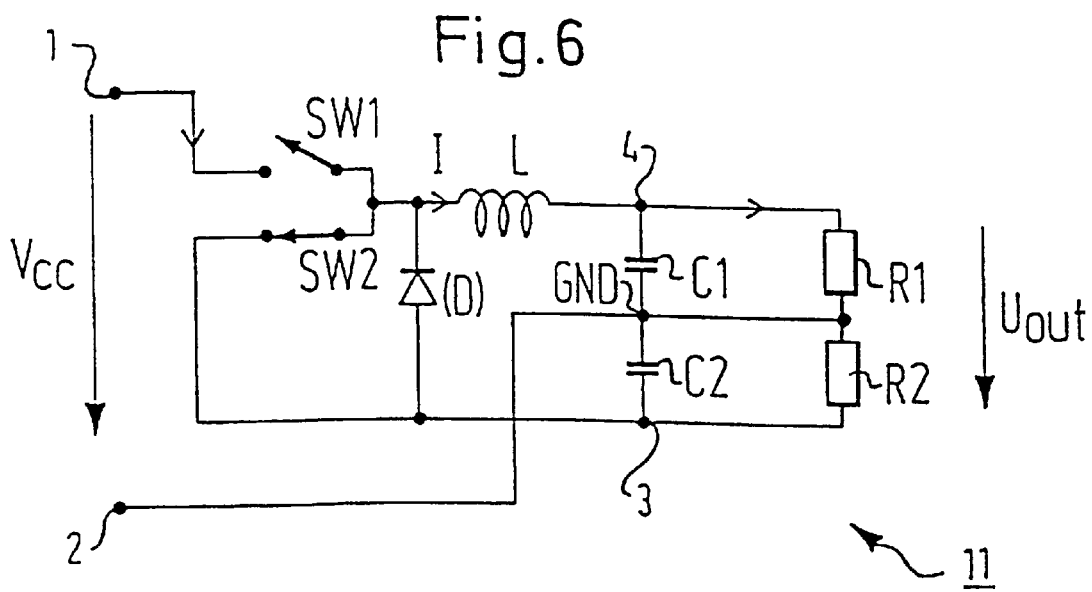

Fig. 12

| Tin | Cyc | Stat | SW1 | SW2 |
|---|---|---|---|---|
| 1 | A | 1 | CCC | 000 |
| 1 | A | 1 | CCC | 000 |
| 0 | A->B | 2 | OCC | 000 |
| 0 | A->B | 3 | OOC | 000 |
| 0 | A->B | 4 | 000 | 000 |
| 0 | A->B | 5 | 000 | COO |
| 0 | A->B | 6 | 000 | CCO |
| 0 | B | 7 | 000 | CCC |
| 0 | B | 7 | 000 | CCC |
| ⋮ | ⋮ | ⋮ | ... | ... |
| 0 | B | 7 | 000 | CCC |
| 1 | B->A | 8 | 000 | OCC |
| 1 | B->A | 9 | 000 | OOC |
| 1 | B->A | 10 | 000 | 000 |
| 1 | B->A | 11 | COO | 000 |
| 1 | B->A | 12 | CCO | 000 |
| 1 | A | 1 | CCC | 000 |
| 1 | A | 1 | CCC | 000 |
| ⋮ | ⋮ | ⋮ | ... | ... |
| 1 | A | 1 | CCC | 000 |
| 0 | A->B | 2 | OCC | 000 |
| ⋮ | ⋮ | ⋮ | ... | ... |

OUTPUT BUFFER SWITCHING CIRCUIT

The present invention concerns an output buffer circuit for outputting digital signals and a method of operating an output buffer circuit.

A variety of concepts for digital logic circuits and digital signalling between circuits is presently known. Early concepts are DTL (Diode-Transistor Logic), TTL (Transistor-Transistor Logic) and ECL (Emitter Coupled Logic), which concepts are used with digital logic circuits as well as for digital signalling between circuits or circuit boards.

Concepts designed for transmission of digital data with a high data rate preferably employ a differential transmission and reception of digital data, using a pair of signalling wires. DPECL (Differential Positive Emitter Coupled Logic), LVDS (Low Voltage Differential Signalling) and GLVDS (Grounded Low Voltage Differential Signalling) are examples of signalling concepts which use differential signalling. Differential signalling enables keeping the differential voltage across the pair of signalling wires low as due to the differential concept spurious voltage drops across a ground line connecting the transmitter with the receiver will not adversely affect the quality of data transmission. Low differential signalling voltages in turn keep the power transmitted over low impedance transmission lines within reasonable limits.

With the ever increasing complexity of digital circuitry along with a rapid increase of the scale of integration the power efficiency of a specific circuit design becomes more and more important. Given a specified limit for the power dissipation density (power dissipation per unit area), the maximum allowable power dissipation of each circuit component is the lower the higher the integration density. Vice versa, the larger the power dissipation of a particular component, the larger the area occupied by this component on a semiconductor chip.

Power dissipation is a particular problem when designing low impedance output buffer stages operating in a system environment with supply voltages higher than the differential voltage amplitude across the output terminals of the output buffer circuit. In this case, comparatively high currents output by the buffer circuit result in a large amount of power dissipation in the output stages of the buffer.

All the above-mentioned differential signalling concepts operate at fixed nominal voltages related to ground. Each wire operates at two voltage levels referred to as low voltage level and high voltage level, respectively. As an example, DPECL operates with a low voltage level of 3.3 volt and a high voltage level of 4.1 volt. LVDS on the other hand has a low voltage level of 1.0 volt and a high voltage level of 1.4 volt. GLVDS operates with signal levels close to ground, for instance 0 volt and 0.2 volt or approximately symmetrical with respect to ground with an amplitude of about 0.2 volt.

When considering all differential signalling concepts presently available, signalling voltages span from slightly below 0 volt up to more than 4 volt. As a consequence, it is not possible to connect an output buffer circuit conforming to one differential signalling concept with an input conforming to a different signalling concept. Accordingly, a complex circuit design must either stick to a specific signalling concept or must include means for translating between the different signalling levels. The first alternative has the drawback that future developments lack flexibility while the latter alternative requires additional space and power not related to the core functions of the system.

The present invention aims at solving the above-mentioned problems. It is the object of the invention, to provide a power efficient output buffer circuit and a method of operating the same, suitable for driving low impedance transmission lines at high data rates and enabling a space efficient implementation on a semiconductor chip.

It is a further object of the present invention, to provide an output buffer circuit suitable for cooperation with a variety of differential signalling concepts at different voltage levels without sacrificing power efficiency or space on the chip surface.

An output buffer circuit for outputting digital signals according to the present invention comprises an amplifier section for driving a load, e.g. a symmetrical low impedance transmission line or two asymmetric low impedance transmission lines, and moreover comprises a power supply section for supplying power to the amplifier section. The power supply section comprises a pair of input terminals for connection with a power source and a pair of output terminal for connection with said amplifier section; reactance means for temporarily storing energy; and switching means adapted to provide a charging phase in which energy from said power source is charged into said reactance means and a discharging phase in which at least a part of the energy stored in said reactance means is discharged into said output terminals.

A method of operating an output buffer circuit having an amplifier section and a power supply section including input terminals, reactance means for temporarily storing energy and output terminals connected to said amplifier section, according to the present invention comprises the steps connecting the input terminals to a voltage source; connecting said reactance means to said input terminals for charging energy into said reactance means; and connecting said reactance means to said output terminals for discharging at least a part of said energy into said amplifier section.

According to the present invention, a reactance means, for example an inductor or a capacitor, receives energy from a voltage source during a charging phase and forwards this energy to the amplifier section during a discharge phase. By means of appropriately setting the duration of the charging phase and the duration of the discharging phase, it is possible to provide the amplifier section with a supply voltage suitable for power efficient operation without dissipating large amounts of power and thus without generating large amounts of heat. This is possible because suitably setting the duration of the charging phase in relation to the duration of the discharging phase enables transferring just as much power to the amplifier section as is needed for the proper operation, without dissipating excessive power in the power supply section or in the amplifier section.

According to a specific embodiment of the present invention the switching means adapted to provide the charging phase and the discharging phase, respectively, comprises a first semiconductor switch for performing the charging phase, connected between one input terminal of the pair of input terminals and a first terminal of said reactance means. Moreover, said switching means comprises a second semiconductor switch for performing the discharging phase, connected between said first terminal of said reactance means and one output terminal of said pair of output terminals. The second terminal of said reactance means is connected to the other output terminal of said pair of output terminals. In this way, during the charging phase the first switch establishes a loop including the power source connected to the input terminals of the power supply section and the reactance means. This loop may also include the load, i.e. the amplifier section. During the discharging phase the second switch establishes a loop including the reactance means and the load. This embodiment is advantageous for LVDS (low voltage differential signalling) applications, GLVDS (grounded low voltage differential signalling) and DPECL (differential positive emitter coupled logic) applications. According to another specific embodiment of the present invention, the switching means adapted to provide the charging phase and the discharging phase, respectively, provides for disconnection of both input terminals of the power supply section from both output terminals of the power supply section during both the charging phase and the discharging phase. In this way the voltage across the output terminals is floating with respect to the voltage across the input terminals of the power supply section. Floating in this sense means that a voltage connected across an arbitrary one of the input terminals and an arbitrary one of the output terminals of the power supply section will not result in a current flowing from the respective input terminal to the respective output terminal. In other words, the operation of the power supply section is fully independent from the application of such voltages. This property of the power supply section enables driving a large variety of input stages conforming to different signalling concepts, without having to modify the output buffer circuit. The common mode voltage level of the amplifier output relative to an arbitrary reference point, e.g. one of the input terminals of the power supply section, can be entirely determined by the input stage connected to the output of the amplifier section, without adversely affecting the operation of the power supply section or the amplifier section. This offers the opportunity, to flexibly combine different signalling schemes without the need of power and space consuming level conversion.

Preferably, the amplifier section has differential inputs providing a large common mode operating range. If desired, these differential inputs can be driven by a preamplifier stage receiving its power not from the above-described "floating" power supply but from a power supply having a reference to the system ground. This preamplifier section can then act as an interface between single line signalling with reference to ground and the floating amplifier section outputting floating differential signals, i.e. differential signals in principle having an arbitrary common mode voltage level with respect to ground.

It may be advantageous to provide one power supply section for a plurality of different amplifier sections and signal channels. Moreover, the power supply section and the amplifier section or sections may be provided on the same substrate of an integrated circuit, i.e. may be integrated to constitute a single integrated circuit.

In the following the present invention will be described in greater detail with reference to the accompanying drawings.

FIGS. 2a to 2c show schematic diagrams explaining the basic operating principle of the power supply section of an output buffer circuit according to a first embodiment and modifications thereof.

FIG. 3 shows a timing diagram.

FIG. 4 shows a schematic diagram explaining the basic structure of an amplifier section of an output buffer circuit according to the present invention.

FIG. 5 shows the power supply section of an output buffer circuit according to a second embodiment of the present invention.

FIG. 6 shows the power supply section of a GLVDS output buffer circuit according to a third embodiment of the present invention.

FIG. 8 shows the power supply section of an output buffer circuit according to a fourth embodiment of the present invention.

FIG. 12 shows a table for explaining the operation of the switches of FIGS. 2a to 2c, 4, 6 and 8, respectively.

Figure 1:
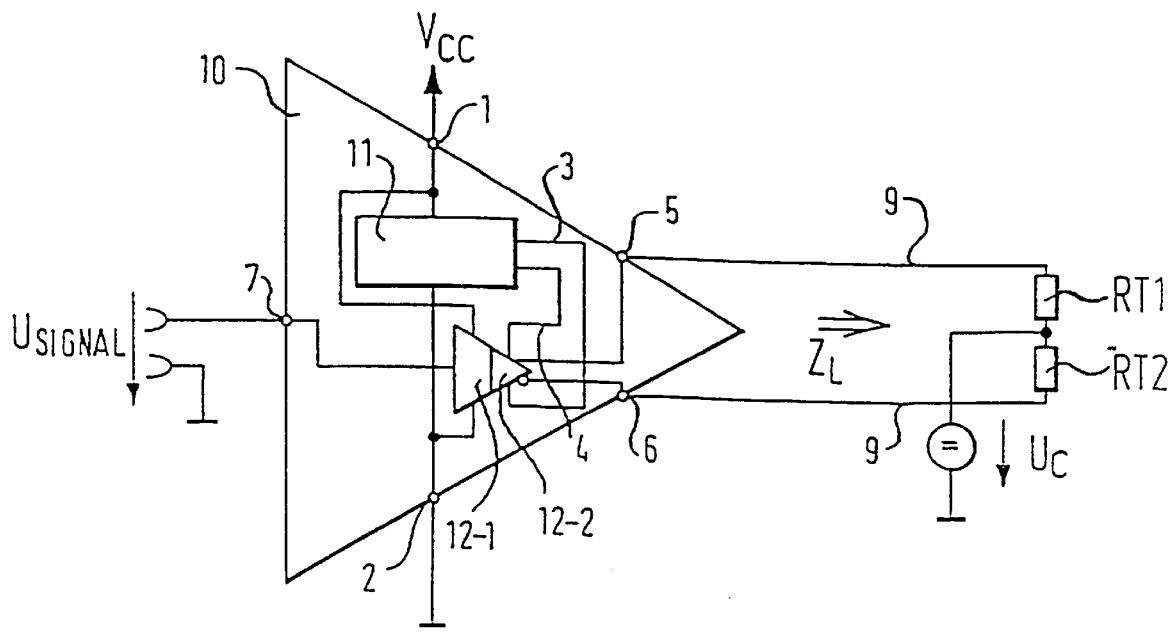
FIG. 1 shows a schematic block diagram of an output buffer circuit according to the present invention.

FIG. 1 shows an overall block diagram of the output buffer circuit according to the present invention. This output buffer circuit 10 comprises an amplifier 12 having a preamplifier section 12-1 and an amplifier section 12-2. The input 7 of the preamplifier section 12-1 receives an input signal $U_{Signal}$ for transmission via a transmission line 9 to an input buffer schematically represented by RT1, RT2 and $U_c$. Transmission line 9 as depicted represents a symmetrical transmission line or the signal wires of a pair of asymetrical transmission lines. In the following the term "transmission line" is used for a symmetrical transmission line, for example twisted pair, or for two asymmetrical transmission lines, for example two coaxial lines with grounded shield wire. Both alternatives are generally applicable in the following for transmitting differential signals. The transmission line 9 is connected to the differential outputs 5 and 6 of the amplifier section 12-2, these outputs 5 and 6 constituting the output terminals of the output buffer circuit 10. Under the assumption that the transmission line 9 is properly terminated by the input stage, the output buffer circuit "sees" the characteristic line impedance $Z_L$. $U_c$ is a voltage source schematically representing a common mode voltage level on the transmission line 9. This voltage source may be located on the side of the output buffer circuit 10 or at the side of the input circuit (as shown in the figure), depending on whether it is the output buffer that determines the common mode voltage level or the input buffer. It may have zero volts or it may not be present at all. Which of these cases is applicable will be discussed below with reference to the respective embodiments.

Reference numeral 11 designates a power supply section for supplying power to the amplifier section 12-2. This power supply section 11 comprises a pair of input terminals 1, 2 connected with a power source (not shown) providing a supply voltage $V_{cc}$. Moreover, the power supply section 11 has output terminals 3, 4 connected with the amplifier section 12-2. This amplifier section 12-2 receives power from the output terminals 3, 4 of the power supply section 11 and thus constitutes a load connected across the output terminals 3, 4 of the power supply section 11. The preamplifier section 12-1 receives its power supply with reference to ground 2. In this way the preamplifier section 12-1 can perform a conversion between single line signalling with reference to ground and differential signalling. Of course, the preamplifier stage 12-1 can be left out if a conversion between single line signalling and differential signalling is not required. This may be the case e.g. if the input signal $U_{Signal}$ is a two-wire differential input signal.

In operation, the amplifier section 12-2 drives the low impedance transmission line $Z_L$ with differential signals corresponding to the input signal $U_{Signal}$. The amplitude of the differential output signal, i.e. the voltage amplitude across output terminals 5 and 6 is just as high as necessary for reliable data transmission, in order to keep the power transmitted over the transmission line 9 as low as possible. Typical values of the differential voltage amplitude across output terminals 5 and 6 are in the range between 100 mV and 500 mV.

Ideally, power supply section 11 does not supply more power to the output stages of the amplifier section 12-2 than fed into the transmission line 9. In this way, unnecessary power dissipation in the output stages of the amplifier section 12-2 can be avoided and the output stage can be kept small. Of course, depending on the type of semiconductor signal switches employed in the output stage of the amplifier section 12-2, a real output stage design will dissipate some minimum amount of power. The same holds if the output stage is required to provide for source impedance matching. However, according to the present invention, the amplifier section 12-2 driving the transmission line 9 is not necessarily responsible for limiting the transmitted power but can be designed to primarily determine the sign of the transmitted electrical signals while power limitation takes place in the power supply section 11. The power supply section 11 in turn is not necessarily concerned with signalling and can be designed to provide maximum power efficiency.

Figure 2A:
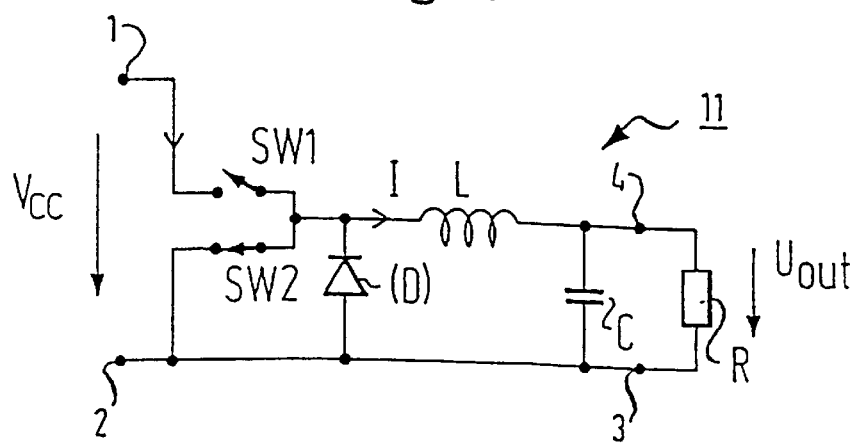

FIG. 2a shows a schematic diagram for explaining the basic operating principle of the power supply section 11 according to a first embodiment of the present invention.

This schematic diagram comprises an inductor L acting as a means for temporarily storing energy and moreover includes switches SW1 and SW2 for controlling the charging of energy from a power source (not shown) connected to terminals 1 and 2 into the inductor L, and the discharging of the energy stored in the inductor L into the amplifier section 12-2 connected to terminals 3 and 4, schematically represented by a resistor R. In this embodiment the switch SW1 is connected between the inductor L and power source terminal 1 providing a supply voltage $V_{CC}$ and controls the charging phase while switch SW2 controls the discharging phase. For this purpose, in this embodiment switch SW2 is connected between the other power source terminal 2 and that terminal of the inductor L that is connected with SW1. A capacitor C may be provided for smoothing the voltage supplied to the load R. A diode D can be connected across the switch SW2 in order to act as a recovery diode or can replace the switch SW2 in order to act as a switch itself. Both the diode D and the capacitor C are advantageous but not necessary for the basic operation of this circuit.

FIG. 3 shows a timing diagram for explaining the basic operation of the circuit of FIG. 2a. This diagram shows an alternation between a first phase A representing the charging phase in which the energy stored in the inductor L is increased, as well as a discharging phase B in which energy stored in the inductor L is discharged to the amplifier section 12-2. The duration of the charging phase A is indicated with ta while the duration of the discharging phase B is indicated with tb.

The state of the switches SW1 and SW2 depends on the phases A and B. In the charging phase A switch SW1 is in a conducting state while switch SW2 is in a non-conducting state. During this phase the power supply voltage $V_{cc}$ connected across the power supply input terminals 1 and 2 appears across the series connection of the inductor L and the load R, resulting in a current I flowing from power supply input terminal 1 through the switch SW1, the inductor L to the output terminal 4 through the amplifier section 12-2 represented by R, through output terminal 3 back to power supply input terminal 2. In this charging phase A the power supplied from the power source at terminals 1 and 2 is partially supplied to the load R and partially increases the energy stored in the inductor L. Assuming ideal components, no power dissipation takes place in this phase.

After expiry of the time ta the switch SW1 changes into a non-conducting state in order to finish the charging phase A and switch SW2 changes into a conducting state in order to begin the discharging phase B. In this phase the current I continues to flow through the inductor L, through the load R and through switch SW2 back to the inductor L. During this phase the inductor L discharges at least a part of the energy accumulated during phase A into the load R and hence supplies power to the amplifier section 12-2. Also in this phase, under the assumption of ideal components no power dissipation takes place. Moreover, in the steady state the amount of energy entering the inductor during the charging phase A corresponds to the amount of energy discharged into the load R during the discharging phase B. Also, the shorter the charging phase relative to the overall duration ta+tb of charging phase and discharging phase, the less energy is transferred from the power source $V_{cc}$ across the input terminals 1 and 2 to the output terminals 3, 4 and into the load R. Accordingly, appropriately setting the duty cycle ta/(ta+tb) enables setting the power flowing into the load R, that is into the amplifier section 12-2, without dissipating power in the power supply section 11.

In order to avoid a short circuit between the power supply terminals 1 and 2, the conducting states of the switches SW1 and SW2 preferably do not overlap in time. This requirement might lead to an overlap in time of the non-conducting states of the switches SW1 and SW2. In this situation a recovery diode D connected across the switch SW2 may close the circuit for the current I urged to flow by the inductor L. If the power dissipation in the diode D due to the forward bias voltage across the diode in this phase is tolerable, switch SW2 may be left out. The principal function of switch SW2 is then taken over by the diode D.

FIG. 2b shows a first modification of the power supply section 11 depicted in FIG. 2a which can advantageously be taken if the output buffer circuit is to generate low and high signal voltage levels just below the supply voltage potential Vcc. Features and function of this modification correspond to the embodiment of FIG. 2a except that terminal 1 of the circuit of FIG. 2b is connected to ground, terminal 2 is connected to Vcc and the diode D, if present, is reversed. Then terminal 3 will have Vcc potential with respect to ground while terminal 4 has a potential lower than Vcc by the voltage across R, with respect to ground.

FIG. 2c shows a second modification of the power supply section 11 depicted in FIG. 2a which can advantageously be taken if the output buffer circuit is to generate low and high signal voltage levels just above the supply voltage potential Vcc. Features and function of this modification correspond to the embodiment of FIG. 2a except that terminal 1 of the circuit of FIG. 2c is connected to ground, terminal 2 is connected to Vcc and the diode D, if present, is reversed. Moreover, input terminal 2 is not directly connected with terminal 3 but is connected with terminal 4 such that during the charging phase A the full power supply voltage Vcc connected across the power supply terminals 1 and 2 appears across the inductor L. During this phase A capacitor C maintains the voltage across the load R. According to this modification output terminal 4 will have Vcc potential while the potential of terminal 3 will be higher than the potential of terminal 4 by the voltage across the load R. This modification is particularly suitable e.g. for driving a receiver according to the 5 Volt DPECL standard with the output buffer circuit operating on a supply voltage Vcc of 3.3 volt.

FIG. 4 shows a schematic diagram for explaining the basic structure of an embodiment of the amplifier section 12-2 according to the present invention. This amplifier section 12-2 comprises power supply terminals 3 and 4 connected with the power supply section 11 and moreover includes signal output terminals 5 and 6 connected with a terminating resistance $R_T$ e.g. via a transmission line 9. The amplifier section 12-2 furthermore includes a change over switch TS1 connected with signal output terminal 5 and a change over switch TS2 connected with signal output terminal 6 for alternately connecting the signal output terminals 5 and 6 with a respective one of the power supply output terminals 3, 4 connected with the power supply section 11. Impedances $Z_{s1}$ to $Z_{s4}$ represent branch impedances connected between the respective change over switches and the respective output terminals 3, 4 of the power supply section 11. As indicated by the dashed line, the positions of the change over switches TS1 and TS2 are determined according to the input signal $U_{Signal}$ to be transmitted to a receiver end (not shown). Depending on the logical level of the signal $U_{Signal}$ the change over switches TS1 and TS2 provide for connection of signal output terminal 5 to terminal 4 of the power supply section 11 and signal output terminal 6 to the terminal 3 of the power supply section 11 or vice versa. The branch impedances $Z_{s1}$ to $Z_{s4}$ can have very low values only determined by the ON resistances of semiconductor switches, e.g. MOSFETS, used for implementing the change over switches TS1 and TS2. If desired, the value of these branch impedances $Z_{s1}$ to $Z_{s4}$ can be increased in order to provide for source impedance matching of the transmission line 9 connected to the output terminals 5 and 6. In this case, for proper source impedance matching a capacitor connected across the power supply terminals 3 and 4 is advantageous, as is shown e.g. in FIG. 2.

If the branch impedances of one branch are the same as the respective branch impedances of the other branch, it is apparent that regardless the logical level of the input signal $U_{Signal}$ the amplifier section 12-2 acts as a load resistor R connected across the output terminals 3 and 4 of the power supply section 11. The value R equals the sum of the impedance connected across the signal output terminals 5 and 6, of the upper branch impedance $Z_{s1}$ or $Z_{s2}$ and of the lower branch impedance $Z_{s3}$ or $Z_{s4}$. If the branch impedances $Z_{s1}$ to $Z_{s4}$ are zero or close to zero, all the power supplied to the amplifier section 12-2 by the power supply section 11 is output to the transmission line 9 connected to the output terminals 5 and 6. In this way the power dissipation in the amplifier section 12-2 can be kept minimum and at the same time the power transmitted via the low impedance transmission line 9 can be controlled by the power supply section 11 with high efficiency and minimum power dissipation by means of appropriately setting the power supplied by the power supply section 11 via the terminals 3 and 4.

FIG. 5 shows a second embodiment of a power supply section 11 of an output buffer circuit that can be used for transmitting digital signals to a receiver conforming to the LVDS standard. According to this standard it is the output buffer 10 that determines the common mode voltage level $V_C$ on the transmission line 9 connected to the signal output terminals 5 and 6 of the output buffer 10. The receiver schematically represented by resistors RT1 and RT2 in FIG. 1 does not provide the common mode voltage level $U_c$. In other words, for the LVDS standard the receiver does not include the voltage source $U_c$ depicted in FIG. 1. According to this standard, the receiver expects the voltages on the respective signal wires of the transmission line 9 to be within a specified interval, all voltage values within the specified interval being positive with respect to ground.

The power supply section 11 depicted in FIG. 5 supplies power to the amplifier section 12-2 connected to the output terminals 3 and 4 of the power supply section 11 and moreover provides for the proper common mode voltage level of the transmission line 9 connected to the signal output terminals 5 and 6 of the amplifier section 12-2.

Similar to the first embodiment of the power supply section 11, the second embodiment of the power supply section 11 comprises an inductor L acting as a means for temporarily storing energy. Moreover, switches SW1 and SW2 are provided for controlling the charging of energy from a power source (not shown) connected to terminals 1 and 2 into the inductor L and the discharging of the energy stored in the inductor L into the amplifier section 12-2 connected to terminals 3 and 4, schematically represented by a resistor R. Similar to the first embodiment of the power supply section 11, the switch SW1 is connected between the inductor L and power source terminal 1 providing a supply voltage $V_{cc}$ and controls the charging phase while switch SW2 controls the discharging phase.

In this embodiment the switch SW2 is connected between a first terminal of an offset voltage source $V_{off}$ and that terminal of the inductor L that is connected with SW1. The second terminal of the offset voltage source $V_{off}$ is connected with power source terminal 2 tied to ground (GND). Terminal 4 is connected with the other end of inductor L while terminal 3 is connected with said first terminal of the offset voltage source $V_{off}$. A diode D can be connected across the switch SW2 in order to act as a recovery diode or can replace the switch SW2 in order to act as a switch itself. A capacitor C1 may be connected between power output terminal 4 and ground in order to smooth the voltage between terminal 4 and ground. Similarly, a capacitor C2 can be connected between terminal 3 and ground for smoothing the voltage between terminal 3 and ground. The capacitors C1, C2 and the diode D are advantageous but not necessary for the basic operation of this circuit. Regarding the function of the optional diode D considerations similar to the embodiment of FIG. 2a hold valid also for this embodiment.

Referring to the timing diagram of FIG. 3, during the charging phase A switch SW1 is in a conducting state while switch SW2 is in a non-conducting state. During this phase the power supply voltage $V_{cc}$ connected across the power supply input terminals 1 and 2 appears across the series connection of the inductor L, the load R and the offset voltage source $V_{off}$, resulting in a current I flowing from the power supply input terminal 1 through the switch SW1, the inductor L to the output terminal 4 through the amplifier section 12-2 represented by R, through the terminal 3 and through the offset voltage source $V_{off}$ back to power supply input terminal 2. In this charging phase A the power from the power source at terminals 1 and 2 is partially supplied to the load R and partially increases the energy stored in the inductor L. Moreover, a part of the power supplied in this phase A flows into the offset voltage source $V_{off}$. In a practical implementation the offset voltage source $V_{off}$ can be a diode in parallel connection with capacitor C2a, the anode of which is said first terminal of the offset voltage source while the cathode is said second terminal of the offset voltage source. With this implementation the current I flowing through the diode can be used for maintaining the offset voltage taking advantage of the forward bias voltage due to the current I. Of course, if a higher offset voltage is required, the diode can be replaced by a Zener diode the cathode of which is said first terminal of said offset voltage while its anode is the second terminal of the offset voltage source.

After expiry of the time ta the switch SW1 changes into a non-conducting state in order to finish the charging phase A and switch SW2 changes into a conducting state in order to begin the discharging phase B in which energy stored in the inductor L is discharged to the amplifier section 12-2 connected to terminals 3 and 4. In this phase the current I continues to flow through the inductor L, through the load R representing the amplifier section 12-2 and through switch SW2 back to the inductor L. During this phase the inductor L discharges at least part of the energy accumulated during phase A into the load R and hence supplies power to the amplifier section 12-2. Under the assumption of ideal components, no power dissipation takes place in this phase. Moreover, as long as there exists no substantial current path from either or both of the output terminals 3, 4 to ground, no substantial current will flow through the offset voltage source $V_{off}$. If the offset voltage source $V_{off}$ is implemented by means of a parallel connection of a diode and a capacitor C2 as explained above, the capacitor C2 will maintain the offset voltage $V_{off}$ during phase B.

Similar to the embodiment of FIG. 2a, appropriately setting the duty cycle ta/(ta+tb) enables setting the power flowing into the amplifier section 12-2 without dissipating substantial amounts of power in the power supply section 11.

A modification (not shown) of the embodiment of FIG. 5 can advantageously be taken for transmitting digital signals to a receiver conforming to the DPECL standard. According to this modification terminal 1 of the circuit of this figure is connected to ground while terminal 2 is connected to Vcc, the polarity of the offset voltage source $V_{off}$ is reversed and diode D, if present, is reversed. Then terminal 3 will have a potential by Voff ower than Vcc while terminal 4 has a potential lower than the potential of terminal 3 by the voltage across R.

FIG. 6 shows a third embodiment of a power supply section 11 that can be used for transmitting digital signals to a receiver conforming to the GLVDS standard. According to this standard the receiver expects the potentials of the input signals to be within a window including the potential of the ground line. For instance, the receiver expects differential signals symmetrical with respect to the ground potential. For this purpose, the GLVDS receiver includes a pair of terminating resistors RT1 and RT2, each resistor connecting one conductor of the transmission line 9 to ground, as shown in FIG. 1 if the voltage source $U_c$ depicted in FIG. 1 is set to zero volts, i.e. represents a short circuit to ground. The power supply section 11 depicted in FIG. 6 supplies power to the amplifier section 12-2 connected to the output terminals 3 and 4 of the power supply section 11 and moreover provides for symmetrical signalling on the transmission line with respect to ground in the sense that one of the conductors of the transmission line is positive with respect to ground while the other conductor of the transmission line 9 is negative with respect to ground. According to this embodiment, this is achieved by means of providing a supply voltage across the output terminals 3 and 4 of the power supply section 11 that is at least approximately symmetrical with respect to ground. This can be achieved by means of designing the power supply section 11 such that a first impedance R1 connecting output terminal 4 of the power supply section 11 to ground is included in a current loop charging the reactance means L during the charging phase while a second impedance R2 connecting output terminal 3 of the power supply section to ground is included in a current loop for discharging the reactance means L during the discharging phase. Impedances R1 and R2 can be schematical representations of the electrical behaviour of the amplifier section 12-2 regarding its connection to terminals 3 and 4 of the power supply section 11.

Specifically, similar to the first and second embodiment of the power supply section 11 the third embodiment of the power supply section 11 comprises an inductor L acting as a means for temporarily storing energy. Moreover, switches SW1 and SW2 are provided for controlling the charging of energy from a power source (not shown) connected to terminals 1 and 2 into the inductor L and for discharging the energy stored in the inductor L into the amplifier section 12-2 connected to terminals 3 and 4 and schematically represented by resistors R1 and R2 respectively connected with one of the output terminals 3 and 4 of the power supply section 11. Both resistors are connected to grounded input terminal 2 of the power supply section 11. Switch SW1 is connected between the inductor L and power source terminal 1 providing a supply voltage $V_{cc}$ with respect to power source terminal 2 and controls the charging phase. The other terminal of the inductor L is connected with output terminal 4 of the power supply section 11.

Switch SW2 is connected between output terminal 3 of the power supply section 11 and that terminal of the inductor L that is connected with SW1. A diode D can be connected across the switch SW2 in order to act as a recovery diode or can replace the switch SW2 in order to act as a switch itself. A capacitor C1 may be connected between power output terminal 4 and ground in order to smooth the voltage between terminal 4 and ground. Similarly, a capacitor C2 can be connected between terminal 3 and ground for smoothing the voltage between terminal 3 and ground. The capacitors C1, C2 and the diode D are advantageous but not necessary for the basic operation of this circuit. Regarding the function of the optional diode D considerations similar to the embodiment of FIG. 2a hold valid also for this embodiment.

Referring to the timing diagram of FIG. 3, during the charging phase A switch SW1 is in a conducting state while switch SW2 is in a non-conducting state. During this phase the power supply voltage $V_{cc}$ connected across the power supply input terminals 1 and 2 appears across the series connection of the inductor L and impedance R1, resulting in a current I flowing from the power supply input terminal 1 through the switch SW1, the inductor L to the output terminal 4, through R1 representing a part of the amplifier section 12-2 to ground connected with the power supply input terminal 2. In this charging phase A the power from the power source at terminals 1 and 2 is partially supplied to the load impedance R1 and partially increases the energy stored in the inductor L. A voltage drop occurring during this phase across load impedance R1 renders output terminal 4 positive with respect to terminal 2 connected to ground.

After expiry of the time ta the switch SW1 changes into a non-conducting state in order to finish the charging phase A and switch SW2 changes into a conducting state in order to begin the discharging phase B in which energy stored in the inductor L is discharged to the amplifier section 12-2 connected to terminals 3 and 4. In this phase the current I continues to flow through the inductor L, through load impedances R1 and R2 representing the amplifier section 12-2 and through switch SW2 back to the inductor L. During this phase the inductor L discharges at least a part of the energy accumulated during phase A into load impedances R1 and R2 and hence supplies power to the amplifier section 12-2. A voltage drop during the discharging phase B across load impedance R1 maintains a positive potential at terminal 4 with respect to ground. A voltage drop occurring during this phase across load impedance R2 renders output terminal 3 negative with respect to terminal 2 connected to ground. The provision of capacitor 2 is particularly advantageous for maintaining the negative voltage at terminal 3 during the subsequent charging phase A.

Under the assumption of ideal components, no power dissipation takes place in the power supply section 11 of this embodiment both in the charging phase A and in the discharging phase B.

Similar to the embodiment of FIG. 2a, appropriately setting the duty cycle ta/(ta+tb) enables setting the power flowing into the amplifier section 12-2 without dissipating substantial amounts of power in the power supply section 11.

Figure 7:
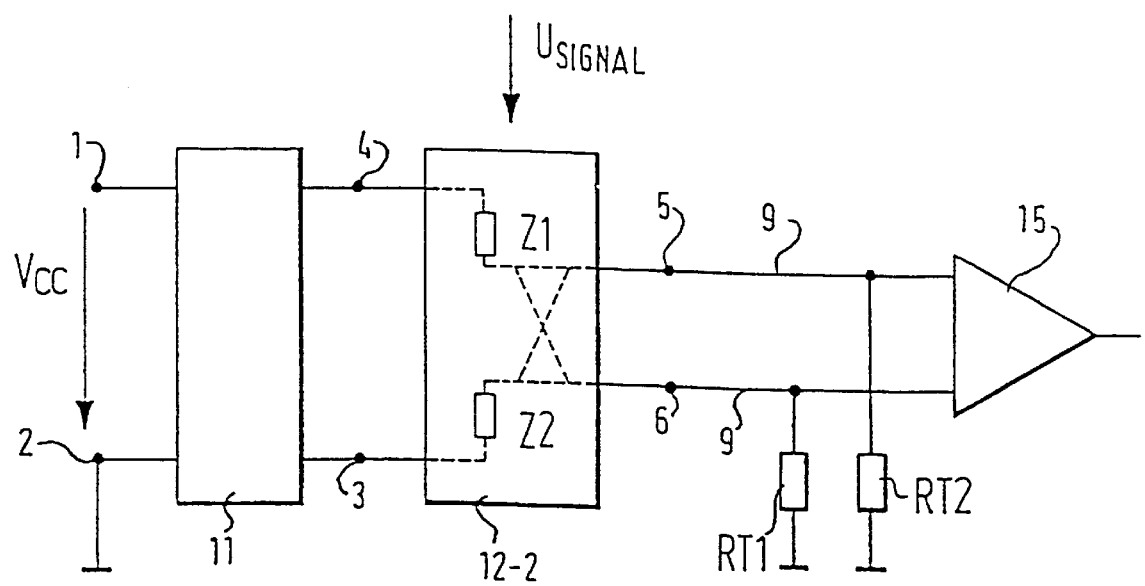
FIG. 7 shows a block diagram for illustrating the interconnections between the power supply section and the amplifier section.

FIG. 7 shows a block diagram for illustrating the interconnections between the power supply section 11 according to any of the embodiments or their modifications disclosed in this description, the amplifier section 12-2 e.g. shown in FIG. 4, and a transmission line 9 to a receiver. The figure shows the GLVDS example that terminating impedance RT1 connects one conductor of the transmission line 9 to ground, and terminating impedance RT2 connects the other conductor of the transmission line 9 to ground. The dashed lines in the amplifier section 12-2 including the impedances Z1 and Z2 represent the circuitry explained in greater detail with reference to FIG. 4, under the assumption that $Z_{S1}$ equals $Z_{S2}$ equals Z1 and $Z_{S3}$ equals $Z_{S4}$ equals Z2, i.e. under the assumption of symmetry of the amplifier section 12-2. The crossing dashed lines in block 12-2 indicate that depending on the logical level of the input signal $U_{signal}$ terminal 4 is connected with terminal 5 via impedance Z1 and terminal 3 is connected with terminal 6 via impedance Z2 or terminal 4 is connected with terminal 6 via impedance Z1 and terminal 3 is connected with terminal 5 via impedance Z2. The receiver amplifier 15 senses the differential signals on the receiver end of the transmission line 9 and converts these signals into appropriate logical levels suitable for further processing by the circuitry driven by the receiver amplifier 15. This amplifier can be any suitable sort of differential amplifier the choice of which is not significant for the present invention.

For the specific case of GLVDS, it is apparent from the schematic block diagram of FIG. 7 that under the assumption Z1=Z2 and RT1=RT2, the connection of the amplifier section 12-2 to output terminals 4 and 3 of the power supply section 11, the connection of transmission line 9 to the signal output terminals 5 and 6 of the amplifier section 12-2 and the connection of terminating impedances RT1 and RT2 between respective conductors of the transmission line 9 and ground is equivalent to connecting a first load impedance R1 between output terminal 4 of the power supply section 11 and ground and a second load impedance PR2 between output terminal 3 of the power supply section 11 and ground, the value of R1 as well as of R2 respectively being the sum of Z1 and RT1, as schematically depicted in FIG. 6. Moreover, from this figure it is generally apparent, that according to the present invention the load impedance across terminals 3 and 4 of the power supply section 11 is constituted by the amplifier section 12-2 having the transmission line 9 connected to its output terminals 5 and 6. If the amplifier section 12-2 is provided symmetrical in the above sense, the load impedance may furthermore be independent of the switching state of the amplifier section 12-2.

FIG. 8 shows a fourth embodiment of power supply section 11 according to the present invention. This embodiment of the power supply section 11 provides across the output terminals 4 and 3, an output voltage $U_{out}$ that is floating with respect to an input voltage $V_{CC}$ applied across input terminals 1 and 2 of the power supply section 11. Floating in this sense means that the potential of any of the output terminals 3 and 4 with respect to any of the input terminals 1 and 2 is undefined. If a voltage within reasonable limits is applied across anyone of the input terminals 1 and 2 and anyone of the output terminals 3 and 4, this voltage will not result in a substantial current flowing between the input side and the output side. Moreover, such voltage will not affect the operation of this embodiment of the power supply section 11.

For this purpose to provide the output voltage floating, this embodiment includes a first pair of switches SW1a, SW1b and a second pair of switches SW2a, SW2b. SW1a and SW2b are connected in series, this series connection being connected between one terminal 1 of the input terminals and one terminal 3 of the output terminals. SW1b and SW2a are connected in series, this series connection being connected between the other terminal 2 of the input terminals and the other terminal 4 of the output terminals. Reference numeral 110 denotes a connecting point between switch SW1a and switch SW2b while reference numeral 22 denotes a connecting point between switch SW1b and switch SW2a. An inductor L is connected between connecting point 110 and connecting point 22. R schematically represents a load impedance constituted by the amplifier section 12-2 connected to the output terminals 3 and 4 of the power supply section 11. C denotes a capacitor that may be connected across the output terminals 3 and 4 for smoothing the output voltage $U_{out}$ across terminals 3 and 4. In addition or alternatively, capacitors (not shown) may be provided between each of the output terminals 3, 4 and ground. D1 and D2 denote recovery diodes which may be connected across the switches SW2a and SW2b, respectively.

In this embodiment the first pair of switches SW1a, SW1b are provided for controlling the charging of energy from a power source (not shown) connected to terminals 1 and 2 into the inductor L. The second pair of switches is provided for discharging the energy stored in the inductor L into the amplifier section 12-2 schematically represented by an impedance R. Referring to the timing diagram of FIG. 3, during the charging phase A switches SW1a and SW1b are in a conducting state while the switches SW2a and SW2b are in a non-conducting state. During this phase the power supply voltage $V_{CC}$ connected across the power supply input terminals 1 and 2 appears across the inductor L, resulting in an increase of energy stored in the inductor L acting as reactance means. Under the assumption of ideal components no power dissipation takes place in this phase A.

After expiry of the time ta the switches SW1a and SW1b change into a non-conducting state in order to finish the charging phase A and the switches SW2a and SW2b change into a conducting state in order to begin discharging phase B in which energy stored in the inductor L is discharged into terminals 3 and 4 of the power supply section 11. Connecting a capacitor C across the output terminals 3 and 4 is particularly advantageous for maintaining the output voltage across the output terminals 3, 4 during the subsequent charging phase A.

With this constellation of the switches SW1a, SW1b and SW2a, SW2b it is possible to maintain all input terminals 1, 2 continuously disconnected from all output terminals 3, 4, while controlling the energy transfer from the input terminals to the output terminals. Namely, during the charging phase A switches SW1a and SW1b are conducting but switches SW2a and SW2b are non-conducting such that through said two pairs of switches and said reactance means, no electrical connection exists between any of the input terminals 1, 2 and any of the output terminals 3,4. The same holds valid for the discharging phase in which the switches SW1a and SW1b are non-conducting, while the switches SW2a and SW2b are in a conducting state. Due to this continuous disconnection of input terminals 1, 2 from output terminals 3, 4 a floating output voltage appears across the output terminals 3, 4, i.e. an output voltage without a predetermined reference to the potential of the input terminals 1, 2.

In order to avoid a short circuit between the power supply terminals 1 and 2 and the output terminals 3 and 4 of the power supply section 11, the conducting states of the first pair of switches SW1a, SW1b and the second pair of switches SW2a, SW2b do preferably not overlap in time. This requirement might lead to an overlapping time of the non-conducting states of both pairs of switches. In this situation recovery diodes D1 and D2 connected across switch SW2a and switch SW2b, respectively, may close the circuit for the current urged to flow by the inductor L during the discharging phase B. If the power dissipation in these recovery diodes is tolerable, the second pair of switches SW2a, SW2b may be left out.

Under the assumption of ideal components, no power dissipation takes place in the power supply section 11 of this embodiment both in the charging phase A and in the discharging phase B.

Similar to the embodiment of FIG. 2a, appropriately setting the duty cycle ta/(ta+tb) enables setting the power flowing into the amplifier section 12-2 without dissipating substantial amounts of power in the power supply section 11.

This embodiment is particularly advantageous in that the amplifier section 12-2 driving the transmission line 9, as shown e.g. in FIG. 1, can be kept floating with respect to the potential of power supply terminals 1 and 2 such that also the potential on each of the signal conductors of the transmission line 9 is floating with respect to input terminals 1 and 2. This feature enables the output buffer circuit according to the fourth embodiment to cooperate with input circuits conforming to different signalling standards without level conversion. In other words, an output buffer circuit including a power supply section 11 according to the fourth embodiment is fully flexible regarding common mode voltage levels on the transmission line 9 determined by the receiver. In particular, this output buffer circuit is able to drive all possible alternatives regarding the termination of the transmission line 9 shown in FIG. 1. The output buffer will operate properly if the common mode voltage $U_c$ shown in FIG. 1 takes arbitrary positive or negative values within reasonable limits and is, accordingly, suitable for driving LVDS, GLVDS, DPECL and other similar types of receivers. Moreover, the output buffer circuit according to this embodiment will properly cooperate with receivers which instead of the voltage source $U_c$ in FIG. 1 connect one of the conductors of the transmission line 9 with a predetermined principally arbitrary potential. The output buffer will furthermore properly cooperate with a receiver having floating differential inputs corresponding to the case of the voltage source $U_c$ not being present at all. A voltage source (not shown) may be provided between one of the input terminals 1 and 2 and one of the output terminals 3 and 4, in order to provide the output buffer with the ability to define the common mode voltage level on the transmission line 9. This voltage source can preferably be programmable and/or disconnectable in order to take full advantage of the flexibility offered by the power supply section 11 according to the fourth embodiment.

Figure 9:
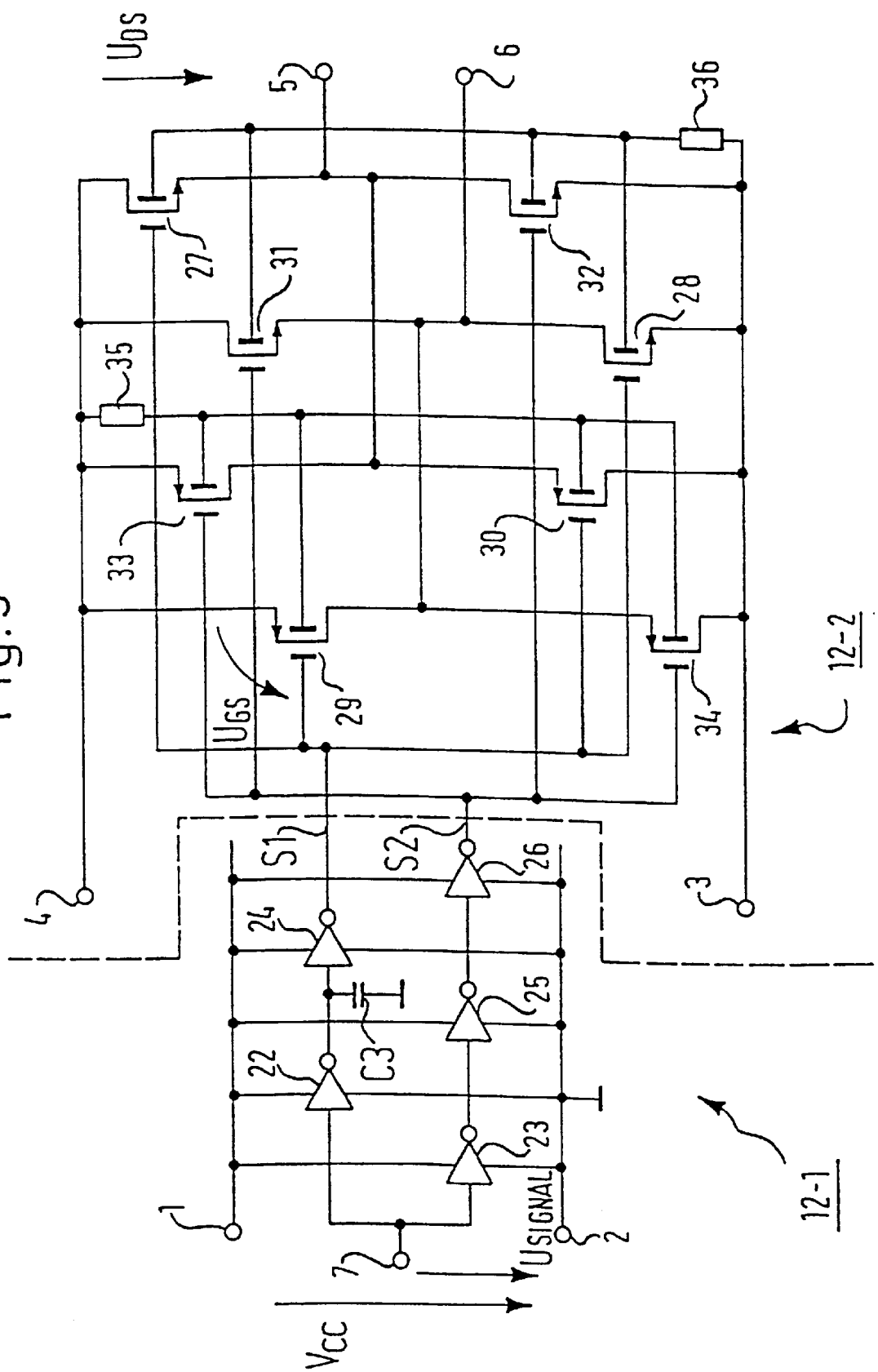
FIG. 9 shows an embodiment of the buffer amplifier section of the output buffer circuit according to the present invention.

FIG. 9 shows an embodiment of a buffer amplifier section 12 including a preamplifier section 12-1 and an amplifier section 12-2 which buffer amplifier section 12 is particularly advantageous in combination with the power supply section 11 according to the fourth embodiment shown in FIG. 8 but can cooperate with any of the embodiments of the power supply section previously described.

The preamplifier section 12-1 and the amplifier section 12-2 of the buffer amplifier section 12 are connected with each other via a pair of complementary signal lines S1 and S2. The differential potential on these lines depends on the logical level of an input signal $U_{signal}$ applied between signal input terminal 7 of the preamplifier section 12-1 and ground terminal 2 of the preamplifier section 12-1. Terminals 1 and 2 are power supply terminals for connection with a voltage source $V_{cc}$ (not shown).

Amplifier section 12-2 comprises power supply terminals 3 and 4 for connection with the output of power supply section 11, e.g. according to the fourth embodiment. Amplifier section 12-2 moreover includes signal output terminals 5 and 6 for connection with the transmission line 9 to the receiver.

As principally shown in FIG. 4, the amplifier section 12-2 of FIG. 8 comprises two changeover switches TS1, TS2, each embodied by a pair of switches, the first pair of switches being associated with signal output terminal 5 while the second pair of switches is associated with signal output terminal 6. Said switches of the amplifier section 12-2 will be called signal switches whenever a confusion with switches of the power supply section 11 might occur. The switches of the first pair are connected in series between power supply terminals 3 and 4 of the amplifier section 12-2. The connecting point between the switches of this pair is connected to signal output terminal 5. The switches of the second pair are connected in series between power supply terminals 3 and 4 of the amplifier section 12-2, the connecting point between the switches being connected to signal output terminal 6.

According to this embodiment, each of the switches comprises an n-channel MOSFET and a p-channel MOSFET, the channels of which are connected in parallel. In particular, in FIG. 9 the first switch connected between signal output terminal 5 and power supply terminal 4 of the first pair of switches comprises n-channel MOSFET 27 and p-channel MOSFET 33. The second switch connected between signal output terminal 5 and power supply terminal 3 comprises n-channel MOSFET 32 and p-channel MOSFET 30. The first switch of the second pair of switches comprises n-channel MOSFET 31 and p-channel MOSFET 29 and is connected between power supply terminal 4 and signal output terminal 6. The second switch of the second pair comprises n-channel MOSFET 28 and p-channel MOSFET 34 and is connected between signal output terminal 6 and power supply terminal 3.

The gates of the n-channel MOSFET transistor and the p-channel MOSFET transistor of each switch receive complementary input signals. In other words, the gates of the n-channel MOSFET transistor and the p-channel MOSFET transistor of each switch are connected with the complementary signal lines S1 and S2 such that when the gate of the n-channel MOSFET transistor is on a high level, the gate of the p-channel MOSFET transistor is on a low level. Moreover, the connection between the eight gates of the eight MOSFETs with the complementary signal lines S1 and S2 from the preamplifier section 12-1 is such that the switch connecting one of the signal output terminals 5, 6 with power supply terminal 4 and the switch connecting the other of the signal output terminals 5, 6 with power supply terminal 3 have the same conducting state, and the remaining two switches have the other conducting state, i.e. conducting or non-conducting. Only one switch of each pair of switches is conducting while the other is non-conducting. Specifically, according to the embodiment of FIG. 9, signal line S1 is connected with the gates of the transistors 27, 28, 29 and 30 while signal line S2 is connected with the gates of transistors 31, 32, 33 and 34.

The impedances $Z_{S1}$ to $Z_{S4}$ shown in FIG. 4 represent the ON resistances of the respective switches in FIG. 9.

Due to the fact that according to this embodiment each of the four switches comprises an n-channel MOSFET transistor and a p-channel MOSFET transistor, the common mode operating range of the amplifier section 12-2 can be significantly increased. In particular, it is desirable that the amplifier section 12-2 operates properly even if potential differences occur between terminals 2 and 3 and/or between terminals 1 and 4. Such potential differences will occur depending on whether a common mode voltage level determined by the receiver is present on the transmission line 9 with respect to ground terminal 2, i.e. depending on whether the voltage source $U_c$ in FIG. 1 is present or not.

If only the n-channel MOSFET transistors were present in each of the four switches, an increasing potential difference between terminal 3 and terminal 2 raising the potential of terminal 3 above the potential of terminal 2 would eventually result in the voltage on the signal lines S1 or S2 being no longer sufficient to turn on the n-channel MOSFETs. However, due to the presence of the p-channel MOSFETs the proper operation of the amplifier section 12-2 will continue because the switching function is then taken over by the p-channel MOSFETs. With increasing potential of terminal 3 with respect to terminal 2 the proper operation can continue until this potential difference is so large that the p-channel MOSFETs will no longer be able to properly switch off.

Accordingly, the provision of p-channel MOSFETs in parallel to n-channel MOSFETs in each of the four switches of the amplifier section 12-2 results in an extension of the common mode operating range of the amplifier section 12-2. When the common mode voltage level on the transmission line represented by $U_c$ in FIG. 1 becomes too high for the n-channel MOSFETs in the amplifier section 12-2 to operate properly, the p-channel MOSFETs in parallel to each of the n-channel MOSFETs takes over the switching operation and thus extend the common mode voltage range 9 on the transmission line which the output buffer 10 is able to handle.

Of course, if the amplifier section 12-2 operates with a substantially invariable common mode voltage level on the transmission line 9, depending on the level of the common mode voltage either the p-channel MOSFETs or the n-channel MOSFETs can be left out. In particular, if the amplifier section 12-2 cooperates with a power supply section of FIG. 2b or 2c, the n-channel MOSFETs may be left out. If the amplifier section cooperates with a power supply section of FIG. 2a or FIG. 6, the p-channel MOSFETs may be left out.

Preamplifier section 12-1 of FIG. 9 is optional and serves to convert an unbalanced input signal applied between signal input terminal 7 and power supply terminal 2 into a differential signal on signal lines S1 and S2 for differentially driving the amplifier section 12-2 such that one of the signal lines S1, S2 has a low voltage while the other signal line is on a high voltage level with respect to terminal 2.

In order to maintain a proper phase relationship between the signals S1 and S2, the preamplifier section 12-1 may include a first chain of inverters 22, 24 serving the purpose of delaying the signal from terminal 7 to signal line S1, as well as a second chain of inverters 23, 25 and 26 for inverting the input signal at terminal 7 of preamplifier section 12-1. In order to achieve approximately equal delay times in both chains of inverters it may be advantageous to connect a capacitor C3 between the input of inverter 24 and ground.

The dashed line in FIG. 9 serves the purpose to illustrate that amplifier section 12-2 is designed floating with respect to preamplifier section 12-1. No other connection is required between the preamplifier section 12-1 and the amplifier section 12-2 than the pair of differential signal lines S1 and S2.

Figure 10:
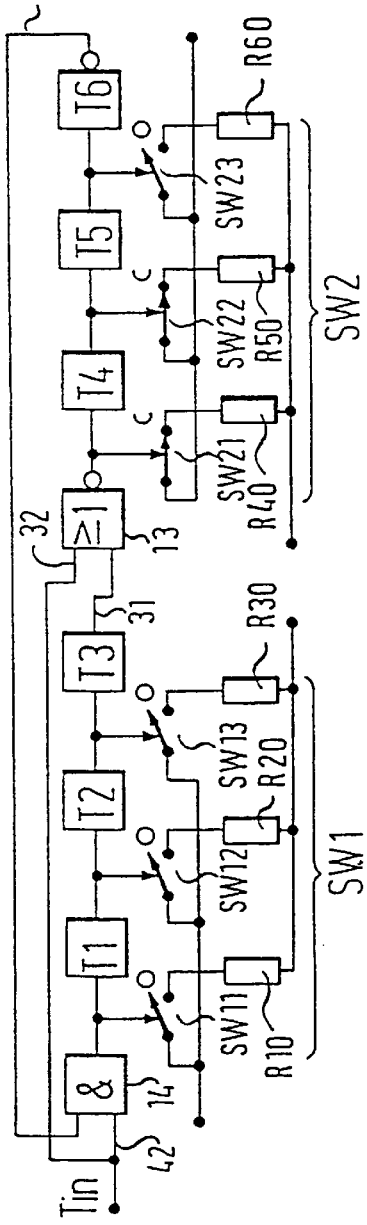
FIG. 10 shows an embodiment of control means for controlling the switching state of the switches of the power supply section according to the first to third embodiments.

FIG. 10 shows a specific embodiment of control means for controlling the switching state of the switches SW1 and SW2 of the power supply section 11 according to any of the first to third embodiments or their modifications. This figure does not show the interconnections between the switches and other parts of the power supply section in order to avoid repetitions.

According to the embodiment of the control means shown in FIG. 10, each of the switches SW1, SW2 comprises a plurality of semiconductor switches. All semiconductor switches of each switch are connected in parallel. In FIG. 10, the switch SW1 comprises three switches SW11, SW12, and SW13 connected in parallel with each other while switch SW2 comprises the semiconductor switches SW21, SW22 and SW23. The impedances R10 to R30 of SW1 and R40 to R60 of SW2 denote the respective ON impedances of the respective semiconductor switch.

For controlling the switching state of each semiconductor switch, for each of the switches SW1 and SW2 a chain of delay circuits for delaying a control signal is provided. In FIG. 10 the chain of delay circuits for switch SW1 comprises the delay elements T1 and T2, the output of delay element T1 being connected with the input of delay element T2. The delay elements T1, T2 control the switching state of the semiconductor switches SW11 to SW13 such that these elements do not simultaneously but sequentially change their switching state, this resulting in switch SW1 gradually changing its conducting state from non-conducting to conducting or from conducting to non-conducting. For this purpose, a control signal applied to the control terminal of switch SW11 is delayed by delay element T1 and the delayed control signal is applied to the control terminal of switch SW12. This delayed control signal is applied to delay element T2, thereby subjected to further delay and then applied to the control terminal of switch SW13.

Similar considerations hold valid for switch SW2 comprising the semiconductor switches SW21 to SW23 the respective ON resistances of which are represented by impedances R40 to R60. The semiconductor switches of SW2 are driven by a second chain of delay circuits T4, T5. The function and operation of the second chain of delay elements T4, T5 and of the semiconductor switches SW21 to SW23 of the second switch SW2 is identical with the corresponding components of switch SW1.

The first chain of delay elements T1, T2 has its input, i.e. the input of delay element T1, connected with the output of two input AND gate 14. The output of the first chain of delay elements T1, T2, i.e. the output of delay element T2, is connected with the input of a further delay element T3 the output of which is connected with one input 31 of a two input NOR gate 13. The output of NOR gate 13 is connected with the input of the second chain of delay elements, i.e. with the input of delay element T4. The output of the second chain of delay elements, i.e. the output of delay element T5 is connected with the input of a further delay element T6 with an inverted output which is connected to one input 41 of AND gate 14. The second input of the AND gate 14 and the second input of the NOR gate 13 are connected together and receive a control signal from a control signal generator (not shown) at control input Tin.

The control signal generator generates a control signal alternating between two logical states corresponding to the alternation between the charging phase A and the discharging phase B, as shown in FIG. 3.

FIG. 12 is a table for illustrating the operation of the semiconductor switches SW11 to SW13 of switch SW1 and the operation of the semiconductor switches SW21 to SW23 of switch SW2 depending on the logical state of the control signal applied to control terminal Tin of the circuit of FIG. 10.

The table of FIG. 12 shows in its left column Tin, the logical state of the control signal Tin. The next column Cyc includes a reference to the charging phase A or discharging phase B depending on the switching states of the switches SW1 and SW2.

The next column Stat indicates the status of all six semiconductor switches SW11 to SW13 and SW21 to SW23 of the circuit of FIG. 10. From this column it is apparent that twelve different switching statuses can be distinguished.

Finally, the columns SW1 and SW2 indicate the switching status of each semiconductor switch. For this purpose, column SW1 includes three sub-columns, the left sub-column relating to SW11, the middle column relating to SW12, the right column relating to SW13. Similarly, the column SW2 includes three sub-columns, the left column relating to SW21, the middle column relating to SW22, the right column relating to SW23. Each of the sub-columns of SW1 and SW2 can have either the entry C indicating the respective semiconductor switch to be in the conducting state, or the entry O indicating that the respective semiconductor switch is in the non-conducting state, i.e. open state. The following explanation starts with switch SW1 being in the fully closed state, i.e. all semiconductor switches of SW1 are conducting while switch SW2 is in the fully open state, i.e. all semiconductor switches of SW2 are non-conducting. This status is labelled status 1 and corresponds to the charging phase A of the power supply section 11.

With the transition of control signal Tin from logical 1 to logical 0 the semiconductor switches of SW1 and SW2 enter a transition from phase A to phase B corresponding to statuses 2 to 6. With the transition of Tin from 1 to 0 the output of AND gate 14 enters the logical state 0 without substantial delay, this resulting in switch SW11 turning non-conductive (status 2). After expiry of the delay time determined by T1 also switch SW12 turns non-conducting (status 3). After a further delay determined by T2 switch SW13 turns non-conducting (status 4). This status 4 is a status wherein all six semiconductor switches are non-conducting and serves to avoid a short circuit between the power supply terminals 1 and 2 of the power supply section 11 due to an overlap of conducting states of SW1 and SW2 in time.

Only after expiry of a delay time determined by T3 input 31 of NOR gate 13 turns low resulting in the output of NOR gate 13 going high and turning switch SW21 of SW2 conductive (status 5). Accordingly, it is the delay time of T3 that determines the duration of status 4. If the delay element T3 is not present, status 5 will substantially immediately follow status 3 which might result in an overlap in time of the conducting state of switch SW13 and SW21. Such overlap can be avoided by means of the delay element T3.

Delay element T4 delays the control signal controlling the switching state of SW21 and after expiry of a delay time determined by T4 switch SW22 enters the conducting state (status 6). After a further delay determined by T5 SW23 enters the conducting state (status 7) finishing the transition between charging phase A and discharging phase B. Status 7 corresponding to the discharging phase B is maintained as long as the control signal at terminal Tin is logical 0.

With the transition of the control signal at Tin from logical 0 to logical 1 the output of NOR gate 13 enters logical 0 such that semiconductor switch SW21 turns non-conducting without substantial delay. The transition of Tin from 0 to 1 initiates the transition from the discharging phase B to the charging phase A corresponding to statuses 8 to 12. While the transition of Tin from 0 to 1 has a substantially immediate effect on the state of switch SW21, switch SW11 remains non-conducting for the time being as the output of AND gate 14 is logical 0 regardless the logical state of Tin due to the output of T6 having turned to logical 0 after expiry of a delay time determined by delay element T6 after semiconductor switch SW23 turned conducting, thus locking the output of AND gate 14 to logical 0. After expiry of the delay time determined by T4 switch SW22 turns non-conducting (status 9) and after a further delay determined by T5 switch SW23 turns non-conducting (status 10). Status 10 corresponds to status 4 in that all semiconductor switches now are in the non-conducting state.

After expiry of a delay time determined by T6 input 41 of AND gate 14 enters logical 1 resulting in the output of AND gate 14 turning into logical 1 and turning switch SW11 conducting (status 11). Accordingly, the delay caused by T6 determines the duration of status 10 wherein all semiconductor switches SW11 to SW13 and SW21 to SW23 are non-conducting. In this way delay element T6 avoids an overlap of the conducting states of SW23 and SW11.

Delay element T1 delays the control signal that turned switch SW11 conductive, by a predetermined delay time and then turns semiconductor switch SW12 conductive (state 12). After expiry of a further delay time determined by T2 semiconductor switch SW13 turns conductive. Now the transition from the discharging phase B to the charging phase A is completed and the semiconductor switches take status 1 until the next change of Tin from 1 to 0, completing a full charging and discharging cycle.

With each of the switches SW1 and SW2 comprising a plurality of semiconductor switches connected in parallel it is possible to control the shape of the current wave form during the transition between charging phase and discharging phase or vice versa. In this way current spikes causing spurious noise in the power supply system can be suppressed. The wave form of the current switched by SW1 and SW2 can be shaped by means of appropriately choosing values for each of the impedances R10, R20, R30 of SW1 and R40, R50 and R60 of SW2. Moreover, the provision of the delay elements T3 and T6 reliably avoids an overlapping time of the conducting states of SW1 and SW2 and provides an overlapping time of the non-conducting states of SW1 and SW2 the duration of which can be properly controlled.

Figure 11:
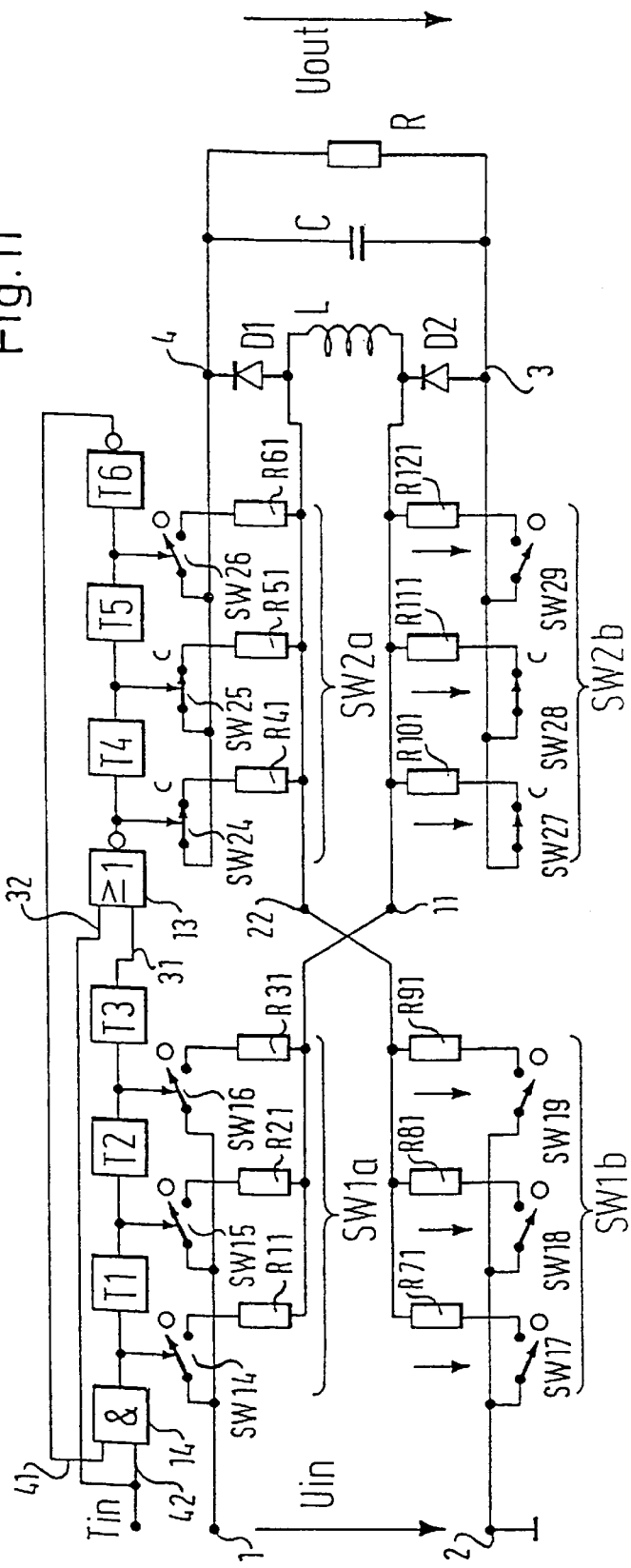
FIG. 11 shows an embodiment of control means for controlling the switching state of the switches of the power supply section according to the fourth embodiment.

FIG. 11 shows an embodiment of control means for controlling the switching state of the switches SW1a, SW1b, SW2a, and SW2b of the power supply section 11 according to the fourth embodiment of the present invention. Similar to the embodiment of FIG. 10 each of the switches SW1*a*, SW1*b*, SW2*a* and SW2*b* comprises a plurality of semiconductor switches connected in parallel. In particular, switch SW1*a* comprises the semiconductor switches SW14, SW15 and SW16. Switch SW1*b* comprises the semiconductor switches SW17, SW18 and SW19. Switch SW2*a* comprises the semiconductor switches SW24, SW25 and SW26. Switch SW2*b* comprises the semiconductor switches SW27, SW28 and SW29. The impedances R11, R21, R31, R41, R51, R61, R71, R81, R91, R101, R111 and R121 represent the ON-impedances of the respective semiconductor switches.

Similar to the embodiment of FIG. 10 FIG. 12 shows a control circuit comprising delay elements T1 to T3 and T4 to T6, a NOR-gate 13 and an AND-gate 14. The interconnection of these elements is identical with what has been described with reference to FIG. 10. In FIG. 11, the output of AND-gate 14 controls the switching state of switches SW14 and SW17, the output of delay element T1 controls the switching state of SW15 and SW18 while the output of delay element T2 controls the switching state of SW16 and SW19. The output of NOR-gate 13 controls the switching state of SW24 and SW27, the output of delay element T4 controls the switching state of SW25 and SW28 while the output of T5 controls the switching state of SW26 and SW29. The arrow above SW17 indicates that the same control signal controlling SW14 also controls SW17 such that the switching states of SW14 and SW17 are always identical. The arrow above SW18 indicates that the same control signal controlling SW15 also controls SW18 such that the switching state of SW15 and SW18 is always identical. Mutatis mutandis, the same holds for the semiconductor switches SW19 and SW27 to SW29.

Regarding the control of the switches SW1*a*, SW1*b* and SW2*a*, SW2*b*, reference is made to the table of FIG. 12. The explanations with reference to FIG. 12 given for the embodiment of FIG. 10 fully apply also for the embodiment of FIG. 11 except that the left sub-column of the column SW1 in FIG. 12 now denotes the switching state of SW14 as well as SW17, the middle column denotes the switching state of SW15 as well as SW18 and the right column denotes the switching state of SW16 as well as SW19. Similarly, the left column of SW2 denotes the switching state of SW24 and SW27. The middle column denotes switching state of SW25 and SW28. The right subcolumn denotes the switching column of SW26 and SW29. The sequence of states from state 1 to state 12 and back to state 1 fully corresponds to what has been described with regard to the embodiment of FIG. 10. In FIG. 11, the delay elements T3 and T6 ensure that there exists no overlap in time between the charging phase A and the discharging phase B. In other words, delay elements T3 and T6 enable controlling the switches SW1*a*, SW1*b* and SW2*a*, SW2*b* such that the input terminals 1, 2 are always disconnected from the output terminals 3, 4 of the power supply section 11 of the fourth embodiment by the switches SW1*a*, SW1*b* and SW2*a*, SW2*b*. Similar to the embodiment of FIG. 10, appropriately choosing the values of the ON-impedances of the semiconductor switches in FIG. 11 enables shaping the wave form of the supply current in order to avoid noisy current spikes in the power supply system.

The semiconductor switches constituting SW1, SW2 in FIG. 10 or constituting SW1*a*, SW1*b*, SW2*a*, SW2*b* in FIG. 11 may be MOSFETs the gates of which act as the respective control terminals and the channels of which act as switches.

The delay elements T1 to T6 can be embodied as a chain of inverters, each inverter driving a capacitor connected between its output and one of the power supply terminals 1, 2.

What is claimed is:

1. Output buffer circuit for outputting digital signals, comprising
   a buffer amplifier section (12) for driving a low impedance symmetrical transmission line and a power supply section (11) for supplying power to the buffer amplifier section (12);
   said power supply section (11) comprising
      a pair of input terminals (1, 2) for connection with a power source ($V_{cc}$) and a pair of output terminals (3,4) connected with said amplifier section (12);
      reactance means (L) for temporarily storing energy;
      switching means (SW) adapted to provide a charging phase (A) in which energy from said power source (Vcc) is charged into said reactance means, and a discharging phase (B) in which at least a part of the energy stored in said reactance means (L) is discharged into said output terminals (3, 4);
   said amplifier section (12) and at least said switch means (SW) of said power supply section (11) being integrated on a common semiconductor chip.

2. Output buffer circuit according to claim 1, characterized in that said switching means (SW) is adapted to provide disconnection of both input terminals (1, 2) from both output terminals (3, 4) during both the charging phase and the discharging phase.

3. Output buffer circuit according to claim 2,
   characterized in that said switching means (SW) comprises
      a first pair of switches (SW1*a*,SW1*b*) for connecting said reactance means (L) with the input terminals (1, 2) in said charging phase and for disconnecting said reactance means from the input terminals (11 2) in said discharging phase; and
      a second pair of switches (SW2*a*,SW2*b*) for connecting said reactance means (L) with said output terminals (3, 4) in said discharge phase and for disconnecting the output terminals (3, 4) from said reactance means (L) in said charging phase.

4. Output buffer circuit according to claim 3,
   characterized in that a first switch (SW1*a*) of said first pair of switches (SW1) and a first switch (SW2*b*) of said second pair of switches are connected in series with a first tap (1) therebetween;
      a second switch (SW1*b*) of said first pair of switches (SW1) and a second switch (SW2*a*) of said second pair of switches (SW2) are connected in series with a second tap (22) therebetween; and
      a first and second terminal, respectively, of said reactance means (L) is connected to said first tap and second tap, respectively.

5. Output buffer circuit according to claim 3, characterized in that some or all of the switches (SW) comprise semiconductor switches.

6. Output buffer circuit according to claim 5, characterized in that said switches of said second pair (SW2) are diodes connected to be forward biased in said discharging phase and reverse biased in said charging phase.

7. Output buffer circuit according to claim 5, characterized in that each semiconductor switch (SW1*a*, SW1*b*, SW2*a*, SW2*b*) comprises a plurality of field effect transistors the channels of which are connected in parallel.

8. Output buffer circuit according to claim 7,
   characterized in that
      each pair of semiconductor switches (SW1, SW2) comprises a chain of delay circuits (T1, T2; T4, T5)

for delaying a control signal controlling the switching state of the semiconductor switches; and the control gates of the field effect transistors of each pair of semiconductor switches are connected to the respective chain of delay circuits.

9. Output buffer circuit according to claim 1, characterized by said switching means (SW) comprising a first semiconductor switch (SW1) for performing said charging phase and a second semiconductor switch (SW2) for performing said discharging phase;

said first switch (SW1) being connected between one input terminal (1) of said pair of input terminals (1,2) and a first terminal of said reactance means (L);

said second switch (SW2) being connected between said first terminal of said reactance means (L) and one output terminal (3) of said pair of output terminals (3,4);

a second terminal of said reactance means (L) being connected to the other output terminal (4) of said pair of output terminals (3,4).

10. Output buffer circuit according to claim 9, characterized in that said one output terminal (3) is connected to the other input terminal (2) of said pair of input terminals (1,2).

11. Output buffer circuit according to claim 9, characterized in that said one output terminal (3) is connected with a first terminal of a voltage source within said power supply section (Voff), the second terminal of which is connected with the other input terminal (2) of said pair of input terminals (1,2).

12. Output circuit buffer according to claim 11, characterized in that said voltage source (Voff) is realized by placing a diode in parallel connection with a capacitor, wherein the anode of said diode is connected with said one output terminal (3) and the cathode of said diode is connected with said other input terminal (2).

13. Output buffer circuit according to claim 9, characterized in that a first load impedance (R1) is connected between said one output terminal (3) and said other input terminal (2); and a second load impedance (R2) is connected between said other output terminal (4) and said other input terminal (2).

14. Output buffer circuit according to claim 13, characterized in that said first and second load impedances (R1, R2) are realized by the connection of a transmission line (9) to the signal output terminals (5, 6) of said buffer amplifier section (12), said buffer amplifier section (12) being connected to the output terminals (3,4) of said power supply section and wherein said connection with said other input terminal (2) is realized by the termination of said transmission line (9).

15. Output buffer circuit according to claim 9, characterized in that each semiconductor switch (SW1, SW2) comprises a plurality of field effect transistors the channels of which are connected in parallel.

16. Output buffer circuit according to claim 15, further comprising:

a first chain of delay circuits (T1, T2) and a second chain of delay circuits (T4, T5) for delaying a control signal (Tin) controlling the switching state of said switches;

the gates of said field effect transistors of said first switch (SW1) being connected to said first chain of delay circuits (T1, T2), the gates of said field effect transistors of said second switch (SW2) being connected to said second chain of delay circuits (T4, T5).

17. Output buffer circuit according to claim 8, characterized in that the output of the first chain of delay circuits (T1, T2) is connected to a first input (31) of a two input NOR gate (13);

the output of said NOR gate (13) is connected to the input of the second chain of delay circuits (T4, T5);

the inverted output of said second chain of delay circuits (T4, T5) is connected to a first input (41) of a two input AND gate (14), the output of which is connected to the input of the first chain of delay circuits (T1, T2); and the second input of said NOR gate (13) and the second input of said AND gate (14) are connected together and adapted to receive said control signal (Tin).

18. Output buffer circuit according to claim 17, characterized in that a first delay circuit (T3) is connected between the output of the first chain of delay circuits (T1, T2) and the first input (31) of said NOR circuit (3); and a second delay circuit (T6) is connected between the output of the second chain of delay circuits and the first input (41) of said AND gate (4).

19. Output buffer circuit according to claim 2, characterized in no less than one recovery diode is connected across each switch of the first and second pair of switches.

20. Output buffer circuit according to claim 1, characterized in that said buffer amplifier section (12) comprises a first pair of signal switches (27,33;30,32) connected in series between said first output terminal (4) and said second output terminal (3) of said power supply section (11) and a second pair of signal switches (29,31;28,34) connected in series between said first output terminal (4) and said second output terminal (3) of said power supply section (11);

a first connecting point between said signal switches (27,33;30,32) of said first pair being connected with a first signal output terminal (5) of said buffer amplifier section (12) and a second connections point between said signal switches (29,31;28,34) of said second pair being connected with a second signal output terminal (6) of said buffer amplifier section (12);

control terminals of said signal switches of said first and second pair being connected such that if an input signal ($U_{signal}$) of said buffer amplifier section (12) takes a first logical level, said first signal output terminal (5) is connected with said first output terminal (4) of said power supply section (11) and said second signal output terminal (6) is connected with said second output terminal (3) of said power supply section; and if said input signal ($U_{signal}$) of said buffer amplifier section (12) takes a second logical level, said first signal output terminal (5) is connected with said second output terminal (3) of said power supply section (11) and said second signal output terminal (6) is connected with said first output terminal (4) of said power supply section (11).

21. Output buffer circuit according to claim 20, characterized in that each of said signal switches comprises an n-channel MOSFET and a p-channel MOSFET the channels of which are connected in parallel and the gates of which receive complementary input signals.

22. Output buffer circuit according to claim 21, characterized in that the gates of said p-channel MOSFETs (29,30) of said first switch (29,31) of said second pair of signal switches and of said second switch (30,32) of said first pair of signal switches and the gates of said n-channel MOSFETs (27,28) of said first switch (27,33) of said first pair of signal switches and of said second switch (28,34) of said second pair of signal switches receive said input signal (S1); and the gates of said p-channel MOSFETs (33,34) of said second switch (28,34) of said second pair of signal switches and of said first switch (27,33) of said first pair of signal switches and the gates of said n-channel MOSFETs (31,32) of said second switch (30,32) of said first pair of signal switches and of said first switch (29,31) of said second pair of signal switches receive the inverted input signal (S2).

23. Output buffer circuit according to claim 1, characterized in that a smoothing reactance (c) is connected across the output terminals (3, 4).

24. Output buffer circuit according to claim 1, characterized in that said reactance means (L) is an inductor.

25. Output buffer circuit according to claim 1, characterized in that it comprises a plurality of amplifier sections (12) for a plurality of signal channels, said plurality of amplifier sections receiving power from the power supply section.

26. Output buffer circuit according to claim 1, characterized by control means for controlling the switching operation of said switches (SW1, SW2, SW1a, SW1b, SW2a, SW2b).

27. Method of operating an output buffer circuit having an amplifier section (12) and a power supply section (11) including input terminals (1, 2), reactance means (L) for temporarily storing energy, and output terminals (3, 4) connected to said amplifier section (12), comprising the steps:

connecting the input terminals (1, 2) to a voltage source (Vcc);

connecting said reactance means (L) to said input terminals (1, 2) for charging energy into said reactance means (L);

connecting said reactance means (L) to said output terminals (3, 4) for discharging at least a part of said energy into said amplifier section (12);

wherein before connecting said reactance means (L) to said output terminals (3, 4) all input terminals are disconnected from said reactance means (L); and before connecting said reactance means (L) to said input terminals (1, 2) all output terminals are disconnected from said reactance means (L).

* * * * *